United States Patent
Chen et al.

(10) Patent No.: US 12,015,042 B2
(45) Date of Patent: Jun. 18, 2024

(54) STRUCTURE AND MATERIAL ENGINEERING METHODS FOR OPTOELECTRONIC DEVICES SIGNAL TO NOISE RATIO ENHANCEMENT

(71) Applicant: Applied Materials, Inc., Santa Clara, CA (US)

(72) Inventors: Papo Chen, San Jose, CA (US); Schubert Chu, San Francisco, CA (US); Errol Antonio C Sanchez, Tracy, CA (US); John Timothy Boland, Aptos, CA (US); Zhiyuan Ye, San Jose, CA (US); Lori Washington, Union City, CA (US); Xianzhi Tao, San Jose, CA (US); Yi-Chiau Huang, Fremont, CA (US); Chen-Ying Wu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 780 days.

(21) Appl. No.: 16/797,807

(22) Filed: Feb. 21, 2020

(65) Prior Publication Data

US 2021/0265416 A1    Aug. 26, 2021

(51) Int. Cl.
  *H01L 27/146* (2006.01)
  *H01L 31/18* (2006.01)

(52) U.S. Cl.
  CPC .... *H01L 27/14636* (2013.01); *H01L 27/1463* (2013.01); *H01L 27/1464* (2013.01); *H01L 27/14643* (2013.01); *H01L 27/14689* (2013.01); *H01L 31/1892* (2013.01)

(58) Field of Classification Search
  CPC ......................................... H01L 27/146–14698
  See application file for complete search history.

(56) References Cited

U.S. PATENT DOCUMENTS

| | | |
|---|---|---|
| 6,593,636 B1 | 7/2003 | Bui et al. |
| 7,262,116 B2 | 8/2007 | Singh et al. |
| 8,207,005 B2 | 6/2012 | Weidman et al. |
| 8,294,185 B2 | 10/2012 | Sakai |
| 8,383,446 B2 | 2/2013 | Sakai |

(Continued)

FOREIGN PATENT DOCUMENTS

| | | |
|---|---|---|
| JP | 2006-287117 A | 10/2006 |
| JP | 2010-192794 A | 9/2010 |

(Continued)

OTHER PUBLICATIONS

International Search Report dated May 21, 2021 for Application No. PCT/US2021/014916.

(Continued)

*Primary Examiner* — Kevin Parendo
(74) *Attorney, Agent, or Firm* — Patterson + Sheridan, LLP

(57) ABSTRACT

A method of fabricating a semiconductor device includes forming an interconnect structure over a front side of a sensor substrate, thinning the sensor substrate from a back side of the sensor substrate, etching trenches into the sensor substrate, pre-cleaning an exposed surface of the sensor substrate, epitaxially growing a charge layer directly on the pre-cleaned exposed surface of the sensor substrate, and forming isolation structures within the etched trenches.

9 Claims, 8 Drawing Sheets

(56) References Cited

U.S. PATENT DOCUMENTS

| | | | |
|---|---|---|---|
| 8,736,006 | B1 | 5/2014 | Tsai et al. |
| 8,946,841 | B2 | 2/2015 | Nakazawa |
| 9,240,431 | B1 | 1/2016 | Zheng et al. |
| 9,502,450 | B2 | 11/2016 | Yanagita et al. |
| 9,595,557 | B2 | 3/2017 | Yanagita et al. |
| 9,673,235 | B2 | 6/2017 | Yanagita et al. |
| 9,728,579 | B2 | 8/2017 | Toda |
| 9,865,640 | B2 | 1/2018 | Fenigstein et al. |
| 9,899,441 | B1* | 2/2018 | Cheng ............... H01L 27/14627 |
| 9,923,010 | B2 | 3/2018 | Yanagita et al. |
| 10,128,291 | B2 | 11/2018 | Yanagita et al. |
| 10,418,404 | B2 | 9/2019 | Yanagita et al. |
| 10,504,953 | B2 | 12/2019 | Yanagita et al. |
| 2006/0208257 | A1 | 9/2006 | Branz et al. |
| 2010/0084731 | A1 | 4/2010 | Lee |
| 2010/0164042 | A1* | 7/2010 | Manabe ............ H01L 27/14698 |
| | | | 257/E21.532 |
| 2010/0214457 | A1 | 8/2010 | Sakai |
| 2012/0033119 | A1 | 2/2012 | Shinohara |
| 2012/0322193 | A1 | 12/2012 | Sakai |
| 2013/0105926 | A1 | 5/2013 | Kao |
| 2013/0113061 | A1* | 5/2013 | Lai ........................ H01L 31/09 |
| | | | 257/E31.127 |
| 2013/0193547 | A1 | 8/2013 | Nakazawa |
| 2014/0054662 | A1 | 2/2014 | Yanagita et al. |
| 2015/0041938 | A1* | 2/2015 | Bedell ............... H01L 27/14687 |
| | | | 257/432 |
| 2015/0228693 | A1 | 8/2015 | Toda |
| 2015/0372031 | A1 | 12/2015 | Junho et al. |
| 2016/0056198 | A1 | 2/2016 | Lee et al. |
| 2016/0172391 | A1 | 6/2016 | Ihara |
| 2016/0211288 | A1 | 7/2016 | Yanagita et al. |
| 2016/0336372 | A1 | 11/2016 | Yanagita et al. |
| 2017/0047371 | A1* | 2/2017 | Lee .................. H01L 27/14643 |
| 2017/0117309 | A1 | 4/2017 | Chen et al. |
| 2017/0162623 | A1 | 6/2017 | Ogawa |
| 2017/0170217 | A1 | 6/2017 | Yanagita et al. |
| 2017/0250211 | A1* | 8/2017 | Chang ................ H01L 27/1463 |
| 2017/0263659 | A1 | 9/2017 | Lin et al. |
| 2017/0271385 | A1 | 9/2017 | Yanagita et al. |
| 2019/0027520 | A1 | 1/2019 | Yanagita et al. |
| 2019/0157322 | A1 | 5/2019 | Li et al. |
| 2019/0206911 | A1 | 7/2019 | Yanagita et al. |
| 2019/0288132 | A1 | 9/2019 | Wang et al. |
| 2020/0066768 | A1* | 2/2020 | Cheng ................ H01L 27/1464 |
| 2021/0193704 | A1* | 6/2021 | Sun .................. H01L 27/14612 |

FOREIGN PATENT DOCUMENTS

| | | |
|---|---|---|
| JP | 2010-251628 A | 11/2010 |
| JP | 2012-038981 A | 2/2012 |
| JP | 2013-157422 A | 8/2013 |
| JP | 2013-175494 A | 9/2013 |
| JP | 2015-228388 A | 12/2015 |
| JP | 2017-107950 A | 6/2017 |
| KR | 2017-0019235 A | 2/2017 |
| KR | 2017-0049336 A | 5/2017 |
| KR | 2019-0056999 A | 5/2019 |

OTHER PUBLICATIONS

Jerram et al. "Back-Thinned CMOS Sensor Optimisation", 12 pages.
Ying Xu et al. "Fabrication and Characterization of Photodiodes for Silicon Nanowire Applications and Backside Illumination", Dec. 2015.University of Dayton. 104 pages.
Korean Office Action dated Oct. 31, 2023 for Application No. 10-2022-7025453.
Japanese Office Action dated Oct. 31, 2023 for Application No. 2022-543660.
Extended European Search Report for European Application No. 21757368.2 dated Mar. 15, 2024.
Written Opinion for Singapore Application No. 11202250976A dated Mar. 11, 2024.

* cited by examiner

STRUCTURE AND MATERIAL ENGINEERING METHODS FOR OPTOELECTRONIC DEVICES SIGNAL TO NOISE RATIO ENHANCEMENT

FIELD

Embodiments described herein are generally related to an optoelectronic device, and more specifically, an image sensor that has an epitaxially grown charge layer on surfaces of pixels to enhance signal-to-noise ratio in the image sensor.

BACKGROUND

Complementary metal-oxide-semiconductor (CMOS) image sensors (CIS) are widely used in various applications such as digital cameras and mobile phones. A CIS uses an array of pixels, such as photodiodes, photogate detectors, or phototransistors, for collecting light projected towards a semiconductor substrate and converting collected photo-energy into electrical signals that can be used in a suitable application. One type of CIS, backside-illuminated (BSI) CIS, typically has a silicon substrate that includes an array of pixels formed inside for sensing and recording an intensity of light entering the substrate from the backside, and some circuitry and input/outputs adjacent the array of pixels for providing an operation environment for the pixels and for supporting external communication with the pixels. During device processing such as etching, polishing, or any other material removing process, a surface of the backside of the substrate (and thus surfaces of the pixels) is damaged and left with dangling bonds and/or defect centers. Charge carriers generated from such dangling bonds and/or defect centers contribute to the formation of noise in the electrical signals in the array of pixels.

Conventional methods for suppressing the generation of noise include passivating the surface of the backside of the substrate, by adding a charge layer (i.e., a layer including charge carriers) near the surface of the backside of the substrate. Charge carriers in the charge layer recombine with charge carriers generated from the dangling bonds and/or defect centers. A charge layer may be formed by implanting a desired type of charges (i.e., positive charges or negative charges that are opposite of the charge carriers generated from the dangling bonds and/or defect centers) into the substrate. Alternatively, a charge layer may be formed by adding a dielectric material on the surface of the backside of the substrate having the opposite type of the desired type of charges, such that the desired type of charges is induced in the substrate near the backside. A buffer oxide layer may be inserted between the surface of the backside of the substrate and the dielectric material for charge separation between the charge carriers in the dielectric layer and the induced charge carriers in the substrate near the surface.

However, recent demand for deeper pixels with high aspect ratio trench isolation (i.e., pixels separated from each other by high aspect ratio trenches) and higher signal-to-noise ratio brings challenges to the conventional methods. A charge layer formed by the conventional methods may not provide enough charge carriers to passivate the surface of the substrate with reasonable fabrication cost and design requirements. Furthermore, a charge layer formed by implantation may also not have a good coverage on sidewalls of trenches of high aspect ratio. A charge layer formed by a thick dielectric layer for better passivation of the induced charge carriers may also have a high absorption coefficient, leading to reduced signal from the array of pixels.

Therefore, there is a need in the art for an improved method for passivating a damaged surface of the backside of a BSI CIS device as well as any damaged surface from etch and/or polishing and more generally an improved structure of a BSI CIS device. The method can also be implemented on frontside-illuminated (FSI) CIS to provide similar benefits as for BSI CIS.

SUMMARY

In one embodiment, a method of fabricating a semiconductor device includes forming an interconnect structure over a front side of a sensor substrate, thinning the sensor substrate from a back side of the sensor substrate, etching trenches into the sensor substrate, pre-cleaning an exposed surface of the sensor substrate, epitaxially growing a charge layer directly on the pre-cleaned exposed surface of the sensor substrate, and forming isolation structures within the etched trenches.

In another embodiment, a method of fabricating a semiconductor device includes epitaxially growing a epitaxially grown layer directly on a surface of a handle substrate, epitaxially growing a semiconductor layer directly on the charge layer, implanting a dopant into the semiconductor layer, etching trenches into the semiconductor layer, forming isolation structures within the etched trenches, forming an interconnect structure over the semiconductor layer, and removing the handle substrate from the epitaxially grown layer.

In yet another embodiment, an image sensor includes a sensor substrate having a front side and a back side, a plurality of pixels formed within the sensor substrate on the back side, a plurality of isolation structures formed within the sensor substrate, wherein the plurality of pixels are isolated from each other by one of the plurality of isolation structures, an interconnect structure over the front side of the sensor substrate, and a charge layer epitaxially grown directly on surfaces of the plurality of pixels on the back side of the sensor substrate.

BRIEF DESCRIPTION OF THE DRAWINGS

Implementations of the present disclosure, briefly summarized above and discussed in greater detail below, can be understood by reference to the illustrative implementations of the disclosure depicted in the appended drawings. It is to be noted, however, that the appended drawings illustrate only typical implementations of this disclosure and are therefore not to be considered limiting of its scope, for the disclosure may admit to other equally effective implementations.

Figure 1:
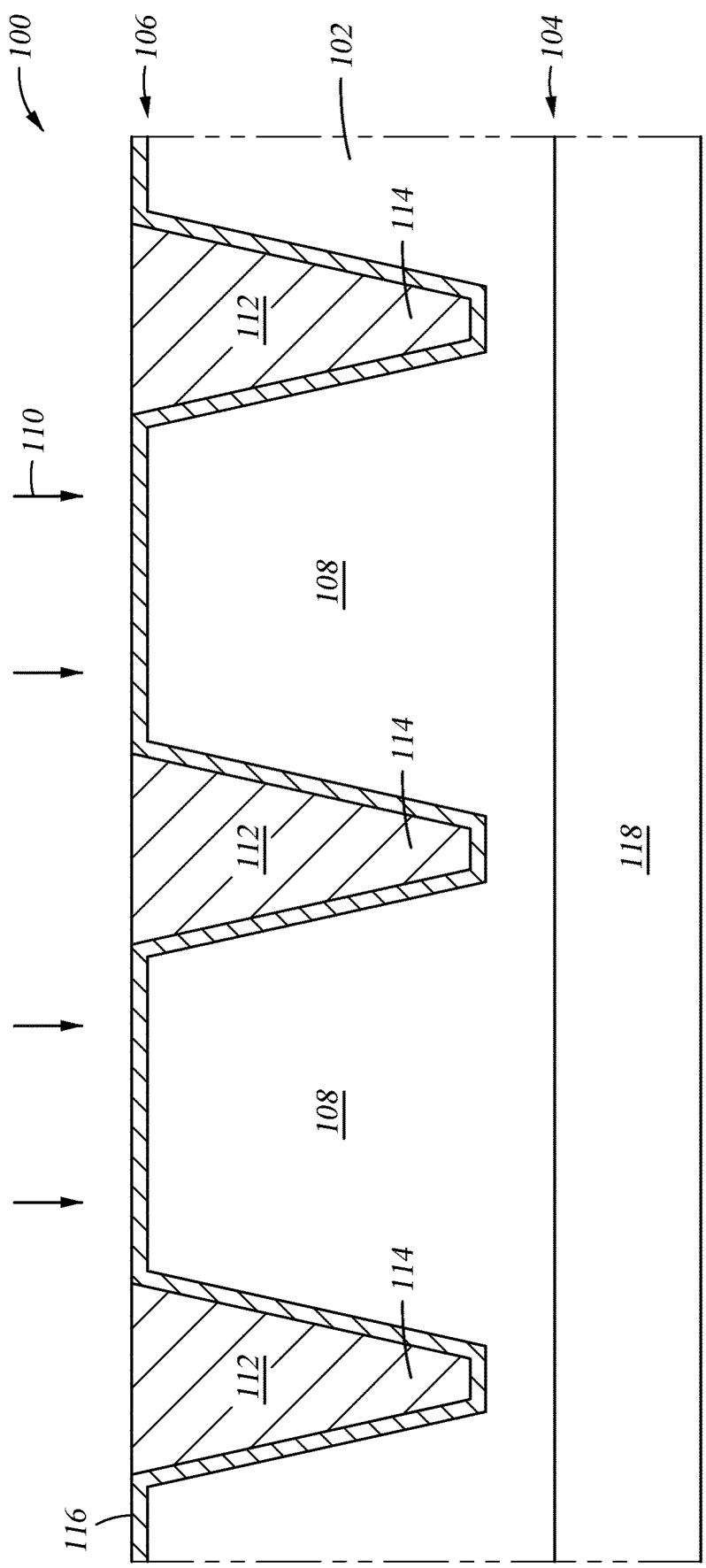
FIG. 1 is a cross sectional view of a back-side illuminated (BSI) image sensor device fabricated according to a first embodiment of the present disclosure.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

Embodiments described herein are generally related to an optoelectronic device, and more specifically, an image sensor that has an epitaxially grown charge layer on surface of pixels to enhance signal to noise ratio in the image sensor.

Image sensors described herein include an epitaxially grown charge layer on a sensor substrate in which pixels are formed. Epitaxially grown charge layers conformally cover damaged surfaces of pixels where undesired carriers (noise) are generated from dangling bonds and/or defect centers caused by device fabrication processes. Epitaxially grown charge layers passivate the charge carriers at the surfaces of pixels, and thus are prevented from causing noise in the electrical signals converted from photo-energy in the pixels.

FIG. 1 is a cross sectional view of a back-side illuminated (BSI) image sensor device 100 fabricated according to a first embodiment of the present disclosure. The image sensor device 100 may be a charge coupled device (CCD), complementary metal oxide semiconductor (CMOS) image sensor (CIS), an active-pixel sensor (APS), or a passive-pixel sensor.

The image sensor device 100 includes a sensor substrate 102 having a front side 104 and a back side 106. The sensor substrate 102 may be a photodiode. In some embodiments, the sensor substrate 102 includes a pinned layer photodiode, a photogate, a reset transistors, a source follower transistor, or a transfer transistor. The sensor substrate 102 is operable to sense incident light 110 that is projected toward the back side 106 of the sensor substrate 102. The sensor substrate 102 absorbs photo-energy of the projected incident light 110 and creates electron-hole pairs near the back side 106 of the sensor substrate 102, inducing mobile charge carriers. The charge carriers are diffused and detected as an electrical signal near the front side 104 of the sensor substrate 102.

The sensor substrate 102 may be a substrate with a p-type dopant such as boron or n-type dopant such as phosphorous or arsenic doped by a suitable implantation process, such as a diffusion process. The substrate may be a bulk silicon, any other suitable semiconducting materials such as crystalline germanium, compound semiconductors such as silicon germanium, silicon carbide, gallium arsenide, gallium phosphide, indium phosphide, indium arsenide, gallium phosphide, indium phosphide, indium arsenide, indium antimonide, Ill-Nitrides or combinations thereof. Alternatively, the substrate may be a silicon-on-insulator (SOI) substrate that includes a semiconductor layer such as silicon or germanium formed on an insulator layer, formed using wafer bonding and/or other suitable methods. The insulator layer may be a buried oxide (BOX) layer formed in a semiconductor substrate. The substrate may have any suitable crystallographic orientation (e.g., a (100), (110), (111), or (001) crystallographic orientation). The thickness of the substrate may range between about 100 microns (μm) and 1000 μm.

In the sensor substrate 102, an array or grid of pixels 108 are formed. The pixels 108 may be varied from one another to have different depths, thicknesses, widths, and so forth. Although only two pixels 108 are illustrated in FIG. 1, any number of pixels 108 may be implemented in the sensor substrate 102. The sensor substrate 102 may further include isolation structures 112, which provide electrical and optical isolation between the pixels 108. The isolation structures 112 may be shallow trench isolation (STI) structures that are formed of a dielectric material such as silicon oxide or silicon nitride filled in trenches 114, deep trench isolation (DTI) structures that are formed of a dielectric or polymetallic materials in the trenches 114, or a capacitor with airgaps in the trenches 114. The trenches 114 are formed by etching the sensor substrate 102. In some embodiments, the isolation structures 112 include doped isolation features, such as heavily doped n-type or p-type regions. Although only three isolation structures 112 are illustrated in FIG. 1, any number of isolation structures may be implemented in the sensor substrate 102 so that the pixels 108 may be properly isolated. The pixels 108 and the trenches 114 have a depth of between about 3 μm and about 10 μm or beyond. The pixels 108 have a width of between about 1.2 μm and about 1.4 μm and may reduce down to about 0.7 μm or beyond. The isolation structures 112 have a width of between about 50 nm and about 300 nm, having an aspect ratio of between 5 and 100 and possibly beyond.

The image sensor device 100 further includes a charge layer 116 epitaxially grown conformally directly on surfaces of the pixels 108 on the back side 106 of the sensor substrate 102, including inner walls of the trenches 114. The pixels 108 may include defect centers and a high concentration of dangling bonds near the surfaces of the pixels 108 on the back side 106 of the sensor substrate 102 due to device processing such as etching to form the trenches 114 and thinning of the sensor substrate 102 from the back side 106. Charge carriers generated from the defect centers and the dangling bonds that would cause the generation of noise in the electrical signals converted from photo-energy in the array of pixels 108 are passivated (i.e., recombined) with charge carriers formed in the charge layer 116. Thus, the noise in the electrical signals is reduced. The charge layer 116 may include boron-doped silicon (Si:B), boron-doped silicon germanium (SiGe:B), boron-doped germanium (Ge:B), or a combination thereof. In some embodiments, the charge layer 116 is formed of carbon-doped silicon (Si:C), which blocks metal diffusion from the front side 104 of the sensor substrate 102, in addition to providing the charge carriers. The charge layer 116 formed of silicon germanium (SiGe), germanium (Ge), or carbon-doped silicon (Si:C) on the sensor substrate 102 formed of doped silicon induces tension at the interface with the sensor substrate 102 due to a lattice mismatch, and thus the indirect bandgap of silicon is modified toward a direct bandgap, which enhances generation of electron-hole pairs and therefore the electrical signal. Thickness of the charge layer 116 may be between about 5 nm and 50 nm. Since such epitaxial charge layer can also serve as extension of pixel area, which could increase the thickness beyond 50 nm depending on integration. A density of formed charge carriers in the charge layer 116 may be between $1 \times 10^{18}/cm^3$ and $5 \times 10^{21}/cm^3$.

The image sensor device 100 may further have an interconnect structure 118 formed over the front side 104 of the sensor substrate 102. The interconnect structure 118 may include a plurality of patterned dielectric layers and conductive layers that provide interconnections (e.g., wiring) between the various doped features, circuitry, and input/output of the image sensor device 100. The interconnect structure 118 may further include an interlayer dielectric (ILD), a multilayer interconnect (MLI) structure, including, for example, contacts, vias, and metal lines. The MLI structure may include aluminum interconnects formed of aluminum/silicon/copper alloy, titanium, titanium nitride, tungsten, polysilicon, metal silicide, or combinations thereof. Alternatively, the MLI structure may include copper multilayers interconnect formed of copper alloy, titanium, titanium nitride, tantalum, tantalum nitride, tungsten, polysilicon, metal silicide, or combinations thereof.

Figure 2:
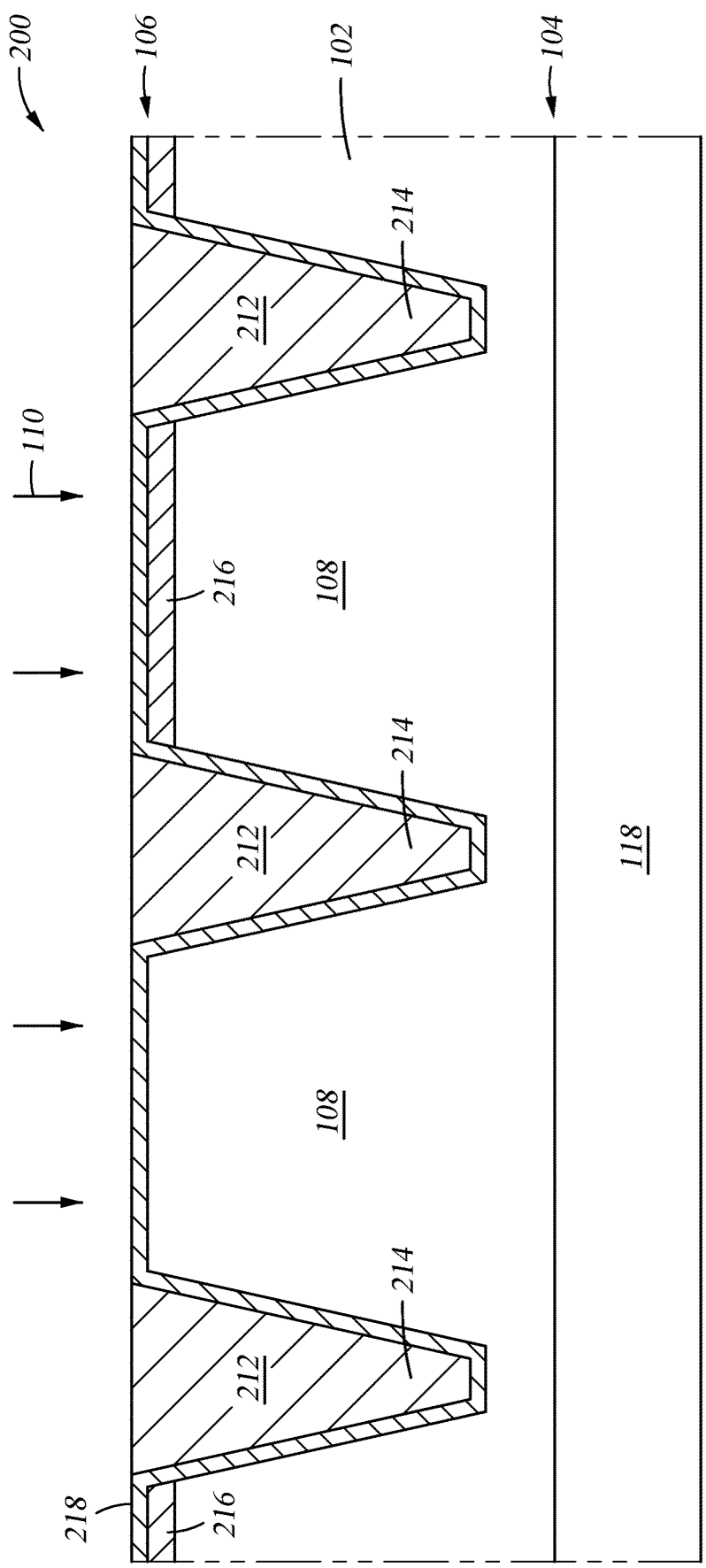
FIG. 2 is a cross sectional view of a back-side illuminated (BSI) image sensor device fabricated according to a second embodiment of the present disclosure.

FIG. 2 is a cross sectional view of a back-side illuminated (BSI) image sensor device 200 fabricated according to a second embodiment of the present disclosure. In the following description, the same reference numerals are used for the components that are substantially the same as those of the first embodiment, and the description of repeated components may be omitted.

The image sensor device 200 includes a sensor substrate 102 having a front side 104 and a back side 106.

In the sensor substrate 102, an array or grid of pixels 108 are formed. The sensor substrate 102 may further include isolation structures 212, which provide electrical and optical isolation between the pixels 108. The isolation structures 212 may be shallow trench isolation (STI) structures that are formed of a dielectric material such as silicon oxide or silicon nitride filled in trenches 214, deep trench isolation (DTI) structures that are formed of a dielectric or polymetallic materials filled in the trenches 214, or a capacitor with airgaps in the trenches 214. The trenches 214 are formed by etching the sensor substrate 102. In some embodiments, the isolation structures 212 include doped isolation features, such as heavily doped n-type or p-type regions. Although only three isolation structures 212 are illustrated in FIG. 2, any number of isolation structures may be implemented in the sensor substrate 102 so that the pixels 108 may be properly isolated.

The image sensor device 200 includes an epitaxially grown layer 216 (referred to as an "Epi layer" hereinafter) directly on top surfaces of the pixels 108 on the back side 106 of the sensor substrate 102. The Epi layer 216 may be formed of boron-doped silicon (Si:B), boron-doped silicon germanium (SiGe:B), or boron-doped germanium (Ge:B), carbon-doped silicon (Si:C). The image sensor device 200 further includes a charge layer 218 over the Epi layer 216 and inner walls of the trenches 214. In some embodiments, the charge layer 218 includes boron-doped silicon (Si:B), boron-doped silicon germanium (SiGe:B), boron-doped germanium (Ge:B), or carbon-doped silicon (Si:C) that is epitaxially grown on the exposed surface of the sensor substrate 102 on the back side 106. In some embodiments, the charge layer 218 is formed by adding a dielectric material on the exposed surface of the sensor substrate 102 on the back side 106 having the opposite type of the desired type of charges, such that the desired type of charges is induced in the substrate near the back side 106.

Figure 3:
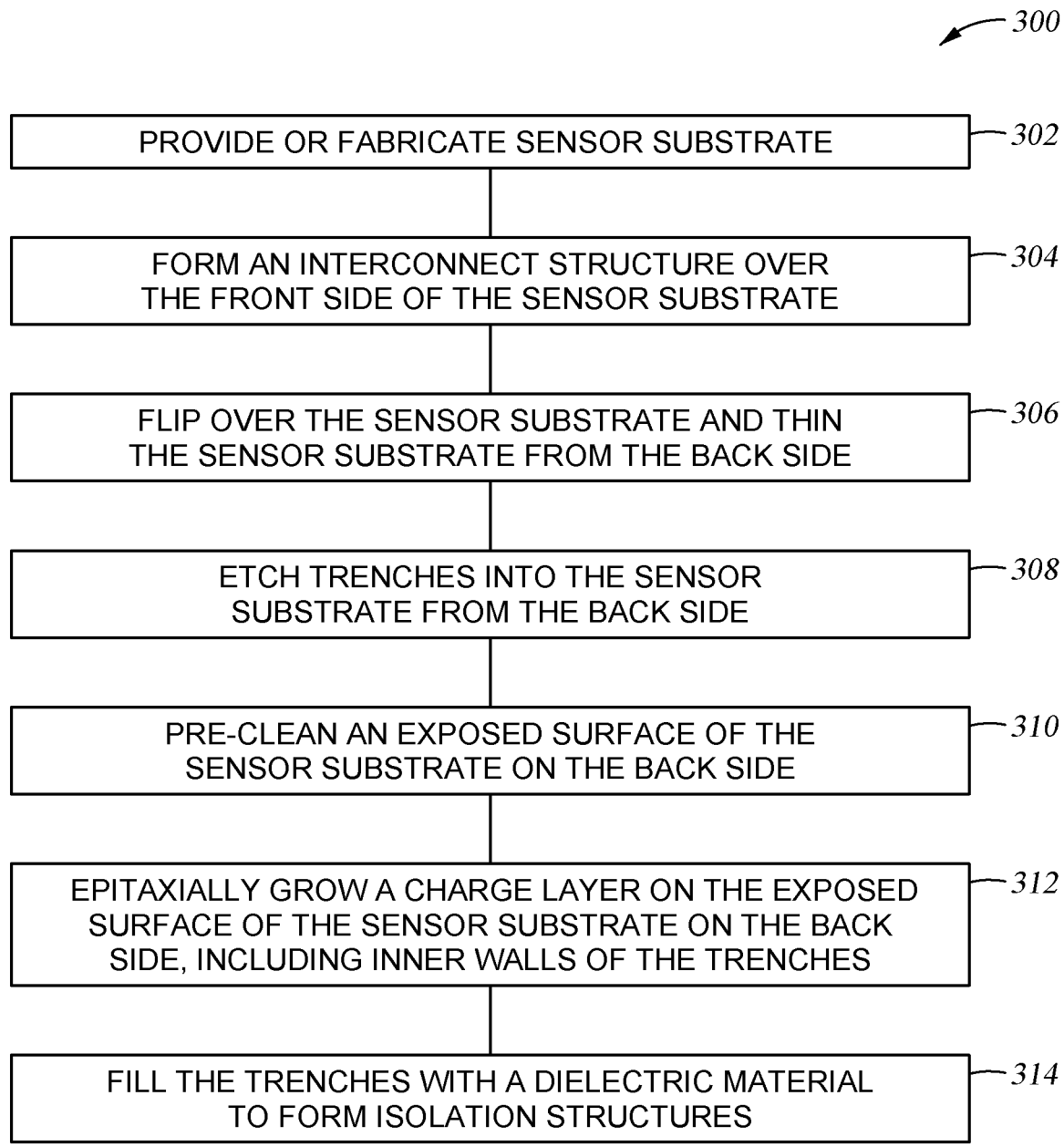
FIG. 3 is a flowchart of a method for fabricating an image sensor device, such as a back-side illuminated (BSI) image sensor according to the first embodiment of the present disclosure.

FIG. 3 is a flowchart of a method 300 for fabricating an image sensor device, such as a back-side illuminated (BSI) image sensor, 100, according to the first embodiment of the present disclosure. FIGS. 4A-4E schematically illustrate intermediate steps performed in the method 300.

Figure 4A:
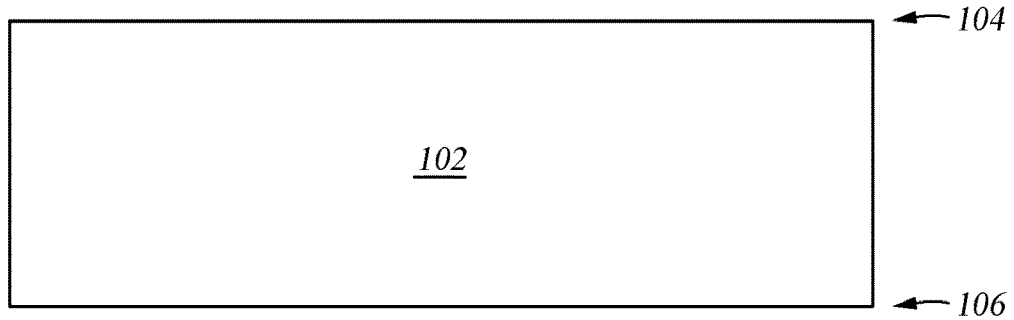
FIGS. 4A, 4B, 4C, 4D, and 4E schematically illustrate intermediate steps performed in a method of fabricating an image sensor device, such as a back-side illuminated (BSI) image sensor according to the first embodiment of the present disclosure.

In block 302 of the method 300, a sensor substrate 102 is provided or fabricated, as shown in FIG. 4A. The sensor substrate 102 may be a photodiode formed of a substrate with a p-type dopant such as boron or n-type dopant such as phosphorous or arsenic doped by a suitable implantation process, such as a diffusion process. The substrate may be a bulk silicon, any other suitable semiconducting materials such as crystalline germanium, compound semiconductors such as silicon germanium, silicon carbide, gallium arsenide, gallium phosphide, indium phosphide, indium arsenide, gallium phosphide, indium phosphide, indium arsenide, indium antimonide, Ill-Nitrides or combinations thereof. Alternatively, the substrate may be a silicon-on-insulator (SOI) substrate that includes a semiconductor layer such as silicon or germanium formed on an insulator layer, formed using wafer bonding and/or other suitable methods. The insulator layer may be a buried oxide (BOX) layer formed in a semiconductor substrate. The substrate may have any suitable crystallographic orientation (e.g., a (100), (110), (111), or (001) crystallographic orientation). The thickness of the substrate may range between about 100 microns (μm) and 1000 μm.

Figure 4B:
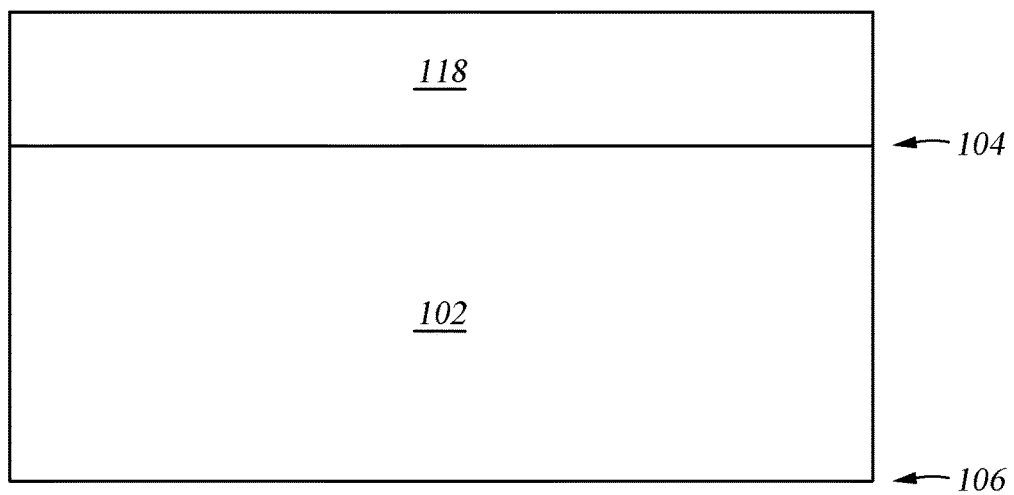

In block 304 of the method 300, an interconnect structure 118 is formed over the front side 104 of the sensor substrate 102, as shown in FIG. 4B. The interconnect structure 118 may include a plurality of patterned dielectric layers and conductive layers that provide interconnections (e.g., wiring) between the various doped features, circuitry, and input/output of the image sensor device 100. The interconnect structure 118 may further include an interlayer dielectric (ILD), a multilayer interconnect (MLI) structure, including, for example, contacts, vias, and metal lines. The MLI structure may include aluminum interconnects formed of aluminum/silicon/copper alloy, titanium, titanium nitride, tungsten, polysilicon, metal silicide, or combinations thereof. Aluminum interconnects may be formed by a process, for example, physical vapor deposition (PVD) (or sputtering), chemical vapor deposition (CVD), atomic layer deposition (ALD), photolithography processing, etching to pattern the conductive materials for vertical connection (for example, vias/contacts) and horizontal connection (for example, conductive lines), or combinations thereof. Alternatively, the MLI structure may include copper multilayers interconnect formed of copper alloy, titanium, titanium nitride, tantalum, tantalum nitride, tungsten, polysilicon, metal silicide, or combinations thereof. The copper interconnect structure may be formed by a process, for example, CVD, sputtering, plating, or other suitable processes.

Figure 4C:
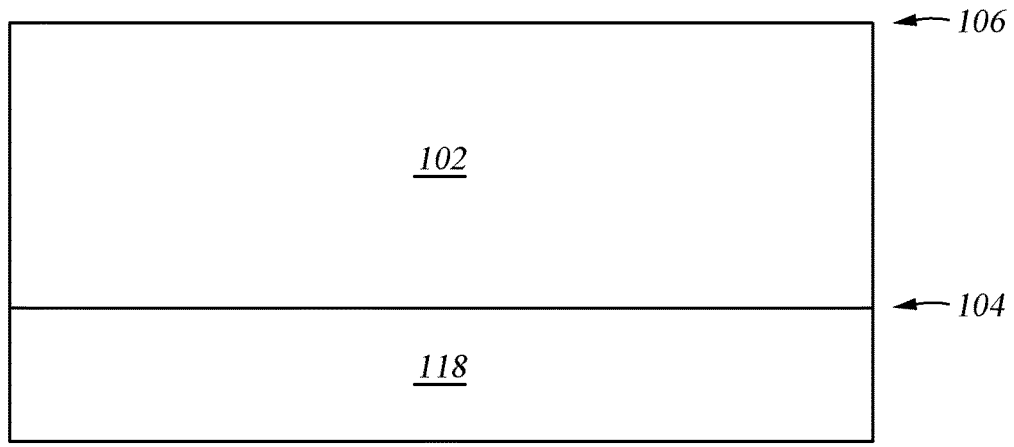

In block 306 of the method 300, the sensor substrate 102 is flipped over and thinned from the back side 106, as shown in FIG. 4C. The sensor substrate 102 is thinned such that charge carriers induced near the back side 106 of the sensor substrate 102 diffuse to the front side 104. The thinning process may include a mechanical grinding process and a chemical thinning process. The mechanical grinding process may first remove substantial amount of substrate material from the sensor substrate 102, and then the chemical thinning process may apply an etching chemical to the back side 106 of the sensor substrate 102 to further thin the sensor substrate 102 to a desired thickness. When the sensor substrate 102 is a SOI type, an imbedded buried oxide layer (BOX) can act as an etching stop layer. A desired thickness of the sensor substrate 102 may vary depending on type of applications and design requirements of the image sensor device, between about 3 μm and about 10 μm.

Figure 4D:
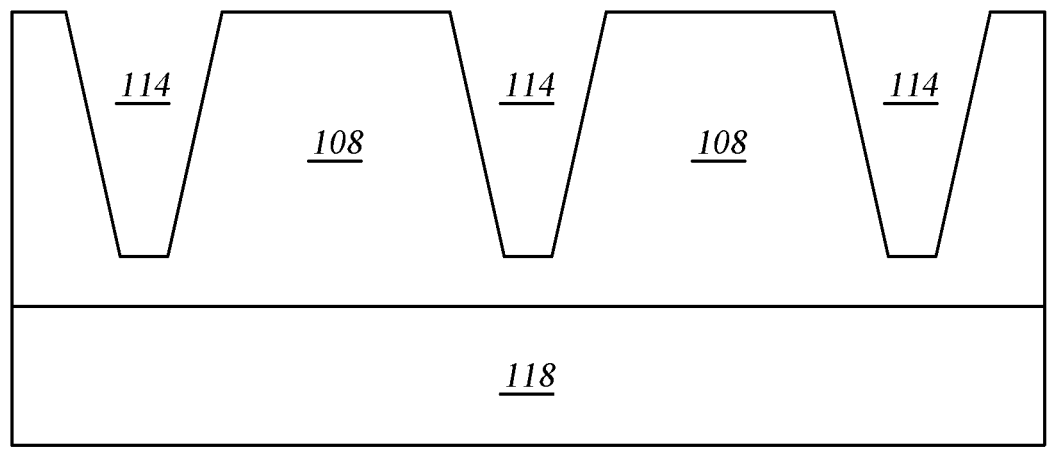

In block 308 of the method 300, trenches 114 are etched into the sensor substrate 102 from the back side 106. Pixels 108 are each defined between two adjacent trenches 114 and an array or grid of pixels 108 are formed. The pixels 108 may be varied from one another to have different depths, thicknesses, widths, and so forth. Although only two pixels 108 and three trenches 114 are illustrated in FIG. 4D, any number of pixels 108 or trenches 114 may be implemented in the sensor substrate 102. The pixels 108 and the trenches 114 have a depth of between about 3 μm and about 10 μm. The pixels 108 have a width of between about 0.7 μm and about 2.5 μm and may reduce down to about 0.5 μm. The trenches 114 have a width of between about 50 nm and about 300 nm, having an aspect ratio of between 50 and 100.

In block 310 of the method 300, an exposed surface of the sensor substrate 102 on the back side 106 is pre-cleaned to remove organic materials, native oxides such as carbon oxide and other impurities, to enhance performance of the image sensor device 100. A cleaning solution may include a mixture of $H_2O_2$—$H_2SO_4$ and/or wet oxidization, dry oxidation and an aqueous HF (hydrofluoric acid). The cleaned surface of the sensor substrate 102 may be dried by a drier to remove any residual liquids or particles. In some embodiments, the pre-cleaning process is performed at a low temperature, about 450° C. or less.

Figure 4E:
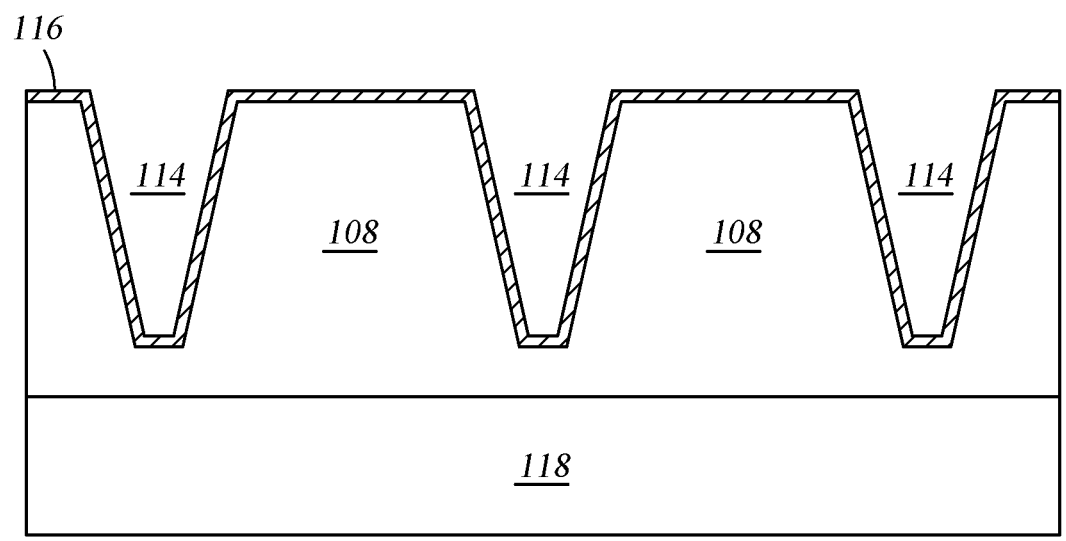

In block 312 of the method 300, a charge layer 116 is epitaxially grown on the exposed surface of the sensor substrate 102 on the back side 106, including inner walls of the trenches 114 (that is, exposed surfaces of the pixels 108), as shown in FIG. 4E. The charge layer 116 may include boron-doped silicon (Si:B), boron-doped silicon germanium (SiGe:B), boron-doped germanium (Ge:B), or carbon-doped silicon (Si:C). The epitaxial growth of the charge layer 116 is performed by supplying a source gas containing a silicon source (e.g., $SiH_4$ or $SiHCl_3$) and a dopant such as a boron compound (e.g., diborane; $B_2H_6$) at a low temperature, about 450° C. or less, to ensure the protection of metal interconnect in wafer front side and the implanted dopants in the sensor substrate 102 not to migrate or be deactivated within sensor substrate 102, which may harm the sensor substrate 102. Due to the nature of the epitaxial growth, the charge layer 116 passivates dangling bonds on the exposed surface and conformally covers the surfaces of the pixels 108 on the back side 106, including the inner walls of the trenches 114. Charge carriers are activated from the dopants (such as boron) as the charge layer 116 is epitaxially grown, without the need for activation anneal as in the case for activating charges from implanted dopants. A density of charge carriers activated from the dopant (such as boron) in the charge layer 116 may be between $1\times10^{18}/cm^3$ and $5\times10^{21}/cm^3$. Charge carrier activated in the charge layer 116 passivate (i.e., recombine with) charge carriers induced at defect centers and dangling bonds near the surfaces of the pixels 108, including inner walls of the trenches 114. Those defect centers and dangling bonds are caused by device processing such as the thinning process in block 306 and the etching process in block 308. Thickness of the charge layer 116 may be between about 5 nm and 50 nm. The charge layer 116 provides the same function of an etch stop layer as the BOX in a SOI type in addition to other functions such as passivation, stress engineering, bandpass filter, or the like. In both a SOI type and the charge layer 116 on the handle substrate 602, total thickness variation (TTV) is therefore determined by deposition processes instead of removal processes.

In block 314 of the method 300, isolation structures 112 are formed as shown in FIG. 1, by filling the trenches 114 with a dielectric material such as silicon oxide or silicon nitrides or polymetallic materials, or forming capacitors with airgaps. In some embodiments, the isolation structures 112 may include heavily doped n-type or p-type regions. The isolation structures 112 provide electrical and optical isolation between the pixels 108.

It should be noted that the particular example embodiments described above are just some possible example methods of fabricating semiconductor devices having integrated circuits according to the present disclosure and do not limit the possible configurations, specifications, or the like of liquid ejecting devices according to the present disclosure. For example, the methods can be applied to fabricate other semiconductor devices such as solar cells. Further, the order of the blocks of the method 300 can be replaced and some of the blocks of the method 300 can be repeated or omitted. The trenches 114 can be etched from the front side 104 of the sensor substrate 102.

Figure 5:
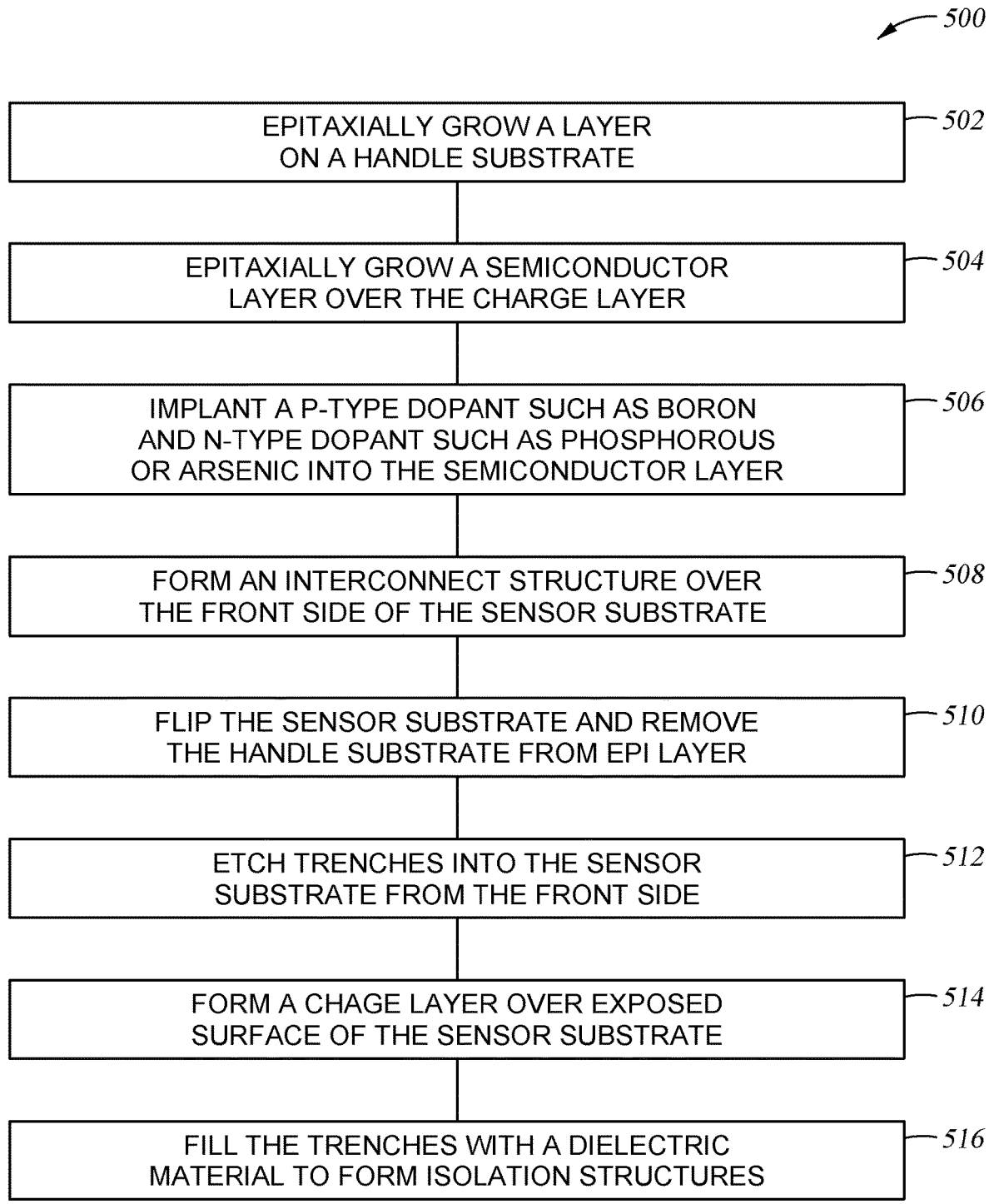
FIG. 5 is a flowchart of a method for fabricating an image sensor device, such as a back-side illuminated (BSI) image sensor device according to the second embodiment of the present disclosure.

FIG. 5 is a flowchart of a method 500 for fabricating an image sensor device, such as a back-side illuminated (BSI) image sensor device, 200, according to the second embodiment of the present disclosure. FIGS. 6A-6F schematically illustrate intermediate steps performed in the method 500. In the following description, the same reference numerals are used for the components that are substantially the same as those of the first embodiment, and the description of repeated components may be omitted. Further, the method 500 according the second embodiment may be combined with the method 300 according to the first embodiment.

Figure 6A:
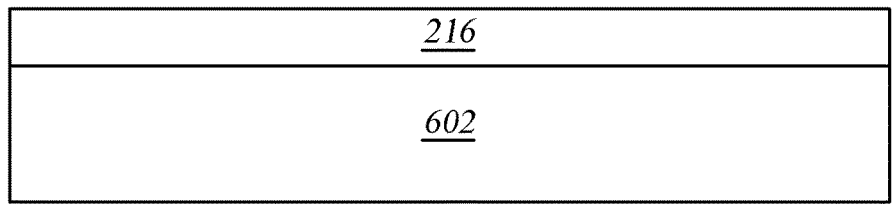
FIGS. 6A, 6B, 6C, 6D, 6E, and 6F schematically illustrate intermediate steps performed in a method fabricating an image sensor device, such as a back-side illuminated (BSI) image sensor according to the second embodiment of the present disclosure.

In block 502 of the method 500, a layer 216 is epitaxially grown on a handle substrate 602, as shown in FIG. 6A. The epitaxially grown layer 216 (referred to as an "Epi layer" hereinafter) may include charges or may not include charges. The handle substrate 602 may be silicon wafer, Ge wafer, SOI wafer, III-V wafer with p-type dopant such as boron or n-type dopant such as phosphorous, arsenic, etc. or intrinsic. The Epi layer 216 may include boron-doped silicon (Si:B), boron-doped silicon germanium (SiGe:B), boron-doped germanium (Ge:B), or carbon-doped silicon (Si:C). The epitaxial growth of the Epi layer 216 is performed by supplying a source gas containing a silicon source (e.g., $SiH_4$ or $SiHCl_3$) and a dopant such as a boron compound (e.g., diborane; $B_2H_6$) at a temperature of between about 500° C. and about 900'C. A density of charge carriers activated from the dopant (such as boron) in the Epi layer 216 may be between $1\times10^{17}/cm^3$ and $5\times10^{21}/cm\ 3$. Thickness of the Epi layer 216 may be between about 5 nm and 100 nm.

Figure 6B:
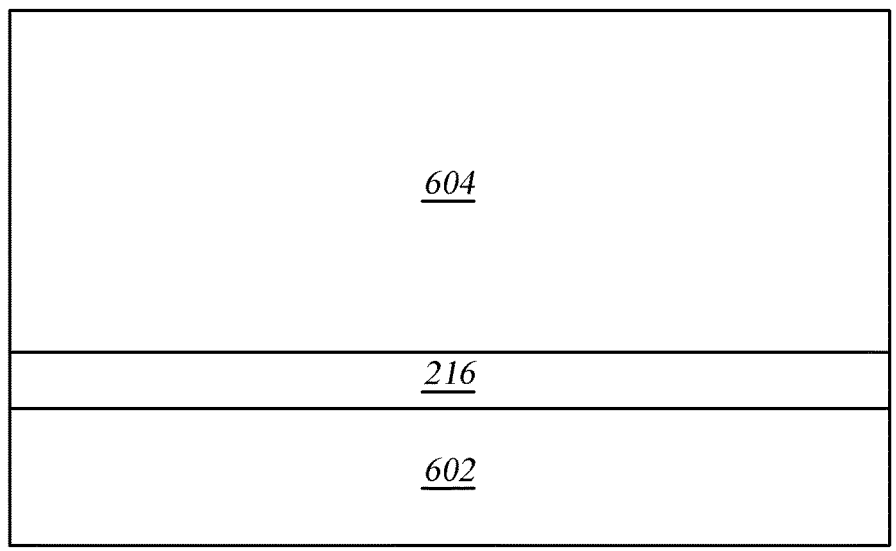

In block 504 of the method 500, a semiconductor layer 604 is epitaxially grown over the Epi layer 216, as shown in FIG. 6B. The semiconductor layer 604 may be a single semiconducting material such as silicon or germanium or a compound semiconductor, such as silicon germanium, gallium arsenic, gallium phosphide, indium phosphide, indium arsenide, and/or indium antimonide, Ill-Nitrides; or combinations. The semiconductor layer 604 may be a silicon-on-insulator (SOI) substrate that include a semiconductor layer such as silicon or germanium formed on an insulator layer using wafer bonding, and/or other suitable methods. The insulator layer may be formed of any suitable material, including silicon oxide, sapphire, other suitable insulating materials, and/or combinations thereof. An exemplary insulator layer may be a buried oxide layer (BOX) or epitaxial oxide/silicon stacking. The insulator layer is formed by any suitable process, such as separation by implantation of oxygen (SIMOX), oxidation, deposition, and/or other suitable process. The substrate may have any suitable crystallographic orientation (e.g., a (100), (110), (111), or (001) crystallographic orientation). The thickness of the semiconductor layer 604 may range between about 100 microns (μm) and 1000 μm.

Figure 6C:
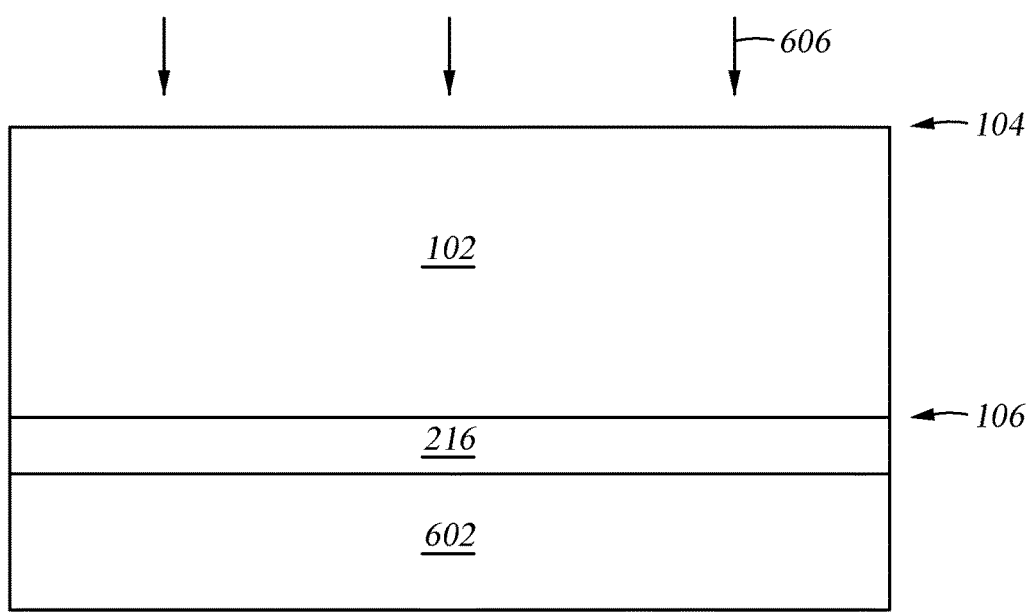

In block 506 of the method 500, a p-type dopant such as boron and n-type dopant such as phosphorous or arsenic is doped into the semiconductor layer 604 by a suitable implantation process 606, such as a diffusion or an epitaxial process to form a sensor substrate 102, as shown in FIG. 6C. A front side 104 of the sensor substrate 102 is exposed and a back side 106 of the sensor substrate 102 is in direct contact with the Epi layer 216.

In block 508 of the method 500, an interconnect structure 118 is formed over the front side 104 of the sensor substrate 102 as in block 304.

Figure 6D:
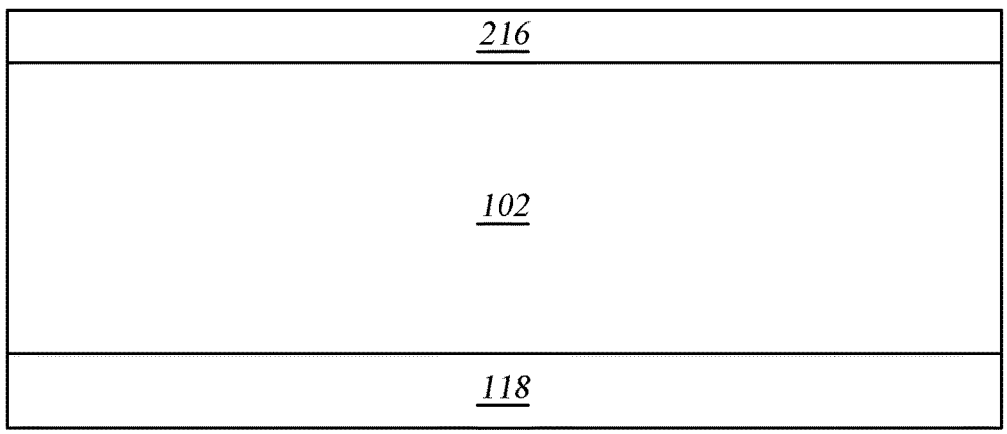

In block 510 of the method 500, the sensor substrate 102 is flipped over and the handle substrate 602 is removed from the Epi layer 216, as shown in FIG. 6D. The handle substrate 602 can be removed by grinding, chemical polishing and wet or dry etching/cleaning. In some embodiments, the Epi layer 216 is formed of material that is with different composition from the handle substrate 602, such as SiGeB, SiGeBC, Si:C, Si:B, Si:P, Si:PC, SiAs. Due to a different material etching rate between the handle substrate 602 and the Epi layer 216, the etching process stops at the Epi layer 216.

Figure 6E:
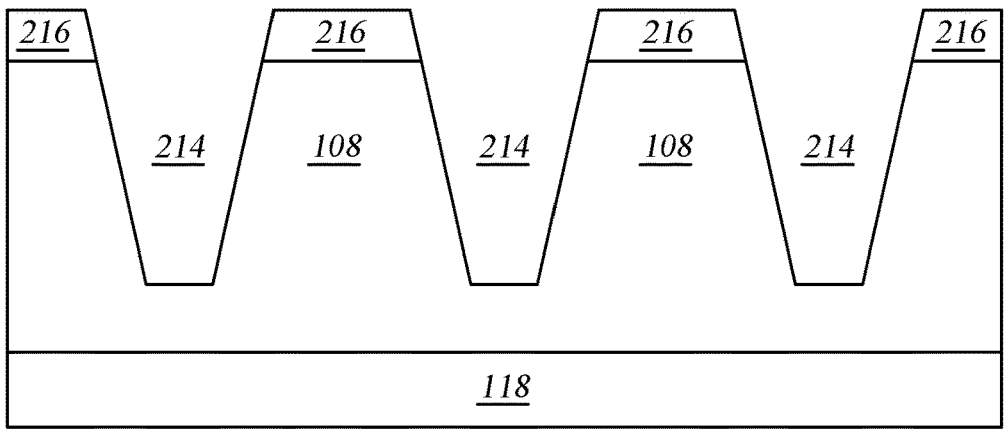

In block 512 of the method 500, trenches 214 are etched into the sensor substrate 102 from the back side 106. Pixels 108 are each defined between two adjacent trenches 214 and an array or grid of pixels 108 are formed. The pixels 108 may be varied from one another to have different depths, thicknesses, widths, and so forth. Although only two pixels 108 and three trenches 214 are illustrated in FIG. 6E, any number of pixels 108 or trenches 214 may be implemented in the sensor substrate 102. The trenches 214 have a width of between about 50 nm and about 300 nm, having an aspect ratio of between 10 and 100.

Figure 6F:
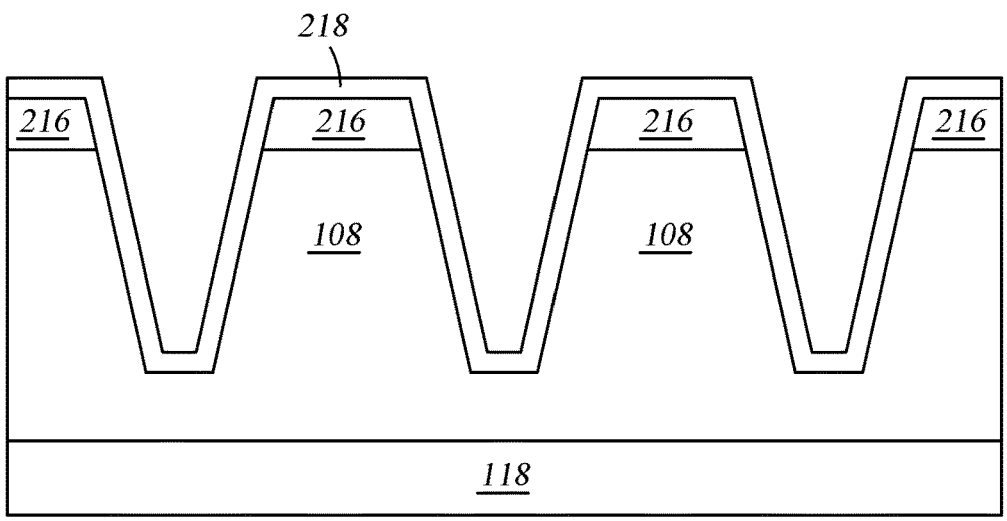

In block 514 of the method 500, a charge layer 218 is formed over the exposed surface of the sensor substrate 102 on the back side 106, including inner walls of the trenches 214, as shown in FIG. 6F. In some embodiments, the charge layer 218 includes boron-doped silicon (Si:B), boron-doped silicon germanium (SiGe:B), boron-doped germanium (Ge:B), or carbon-doped silicon (Si:C) that is epitaxially grown after the exposed surface of the sensor substrate 102 on the back side 106 is pre-cleaned as in block 310 of the method 300. In some embodiments, the charge layer 218 is formed by adding a dielectric material on the exposed surface of the sensor substrate 102 on the back side 106 having the opposite type of the desired type of charges, such that the desired type of charges is induced in the substrate near the back side 106.

In block 516 of the method 500, isolation structures 212 are formed as shown in FIG. 2, by filling the trenches 214 with a dielectric material such as silicon oxide or silicon nitrides or polymetallic materials, or forming capacitors with airgaps. In some embodiments, the isolation structures 212 may include heavily doped n-type or p-type regions. The isolation structures 212 provide electrical and optical isolation between the pixels 108.

It should be noted that the particular example embodiments described above are just some possible example methods of fabricating semiconductor devices having integrated circuits according to the present disclosure and do not limit the possible configurations, specifications, or the like of liquid ejecting devices according to the present disclosure. For example, the methods can be applied to fabricate other semiconductor devices such as solar cells. Further, the order of the blocks of the method 500 can be replaced and some of the blocks of the method 500 can be repeated or omitted. The trenches 214 can be etched from the front side 104 of the sensor substrate 102.

In the example embodiments described above, the image sensors and the methods for fabricating the same are provided to reduce noise in the electrical signals converted from photo-energy in array of pixels. An epitaxially grown charge layer in the image sensors provide a large concentration of charge carriers to passivate excess charge carriers generated at surfaces of pixels in the image sensors. An epitaxially grown charge layer may provide additional functions such as an etch stop layer in a fabrication process or a getter that blocks metal diffusion within the image sensors and/or the stress to engineer the material bandgap/work function near sensor surfaces and/or the separation between signal and noise.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of fabricating a semiconductor device, comprising:
    forming an interconnect structure over a front side of a sensor substrate;
    thinning the sensor substrate from a back side of the sensor substrate;
    etching trenches into the sensor substrate;
    pre-cleaning an exposed surface of the sensor substrate;
    epitaxially growing a charge layer directly on the back side of the pre-cleaned exposed surface of the sensor substrate and within the trenches; and
    forming isolation structures within the etched trenches.

2. The method of claim 1, wherein the sensor substrate is a silicon photodiode.

3. The method of claim 1, wherein the charge layer comprises a material selected from boron-doped silicon, boron-doped silicon germanium, and boron-doped germanium.

4. The method of claim 3, wherein a density of charge carriers in the charge layer is between $1 \times 10^{18}/cm^3$ and $5 \times 10^{21}/cm^3$.

5. The method of claim 1, wherein the charge layer has a thickness of between 5 nm and 50 nm.

6. The method of claim 1, wherein the epitaxial growth of the charge layer is performed at a temperature of 450° C. or less.

7. The method of claim 1, wherein the isolation structures comprise a dielectric material selected from silicon oxide and silicon nitride.

8. The method of claim 1, wherein the isolation structures are formed directly on the charge layer.

9. The method of claim 1, wherein the trenches are etched into the sensor substrate after thinning the sensor substrate from the back side.

* * * * *